United States Patent
Suen et al.

(10) Patent No.: US 11,117,239 B2
(45) Date of Patent: Sep. 14, 2021

(54) CHEMICAL MECHANICAL POLISHING COMPOSITION AND METHOD

(71) Applicant: Taiwan Semiconductor Manufacturing Company, Ltd., Hsinchu (TW)

(72) Inventors: Shich-Chang Suen, Hsinchu (TW); Kei-Wei Chen, Tainan (TW); Liang-Guang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 16/025,263

(22) Filed: Jul. 2, 2018

(65) Prior Publication Data
US 2019/0099853 A1 Apr. 4, 2019

Related U.S. Application Data

(60) Provisional application No. 62/565,697, filed on Sep. 29, 2017.

(51) Int. Cl.
*B24B 37/04* (2012.01)
*H01L 21/306* (2006.01)
(Continued)

(52) U.S. Cl.
CPC .......... *B24B 37/044* (2013.01); *C09G 1/02* (2013.01); *H01L 21/30625* (2013.01); *C09K 3/1436* (2013.01)

(58) Field of Classification Search
CPC ....... B24B 37/044; B24B 37/20; B24B 37/27; B24B 37/34; B24B 57/02; C09G 1/02; H01L 21/30625; C09K 3/1436
See application file for complete search history.

(56) References Cited

U.S. PATENT DOCUMENTS 5,300,130 A * 4/1994 Rostoker ............... C09G 1/02
51/309
5,547,479 A * 8/1996 Conwell ............. C09K 3/1436
51/309
(Continued)

FOREIGN PATENT DOCUMENTS

CN 1199429 A 11/1998
CN 1377395 A 10/2002
(Continued)

OTHER PUBLICATIONS

Mirjalili, F. et al "Effect of stirring time on synthesis of ultra fine alpha-Al2O3 powder by a simple sol-gel method" J. of Ceramic Processing Research, 12 (6) 738-41 (2011). (Year: 2011).*
(Continued)

*Primary Examiner* — Anita K Alanko
(74) *Attorney, Agent, or Firm* — Slater Matsil, LLP (57) ABSTRACT

An abrasive slurry composition for chemical mechanical planarization/polishing (CMP) is provided. The abrasive slurry includes colloidal alumina, a dispersant, and a pH buffer. The colloidal alumina has a particle size of between about 5 nm and about 100 nm. The colloidal alumina may be alpha phase material having a first hardness of about 9 Mohs, or gamma phase material having a second hardness of about 8 Mohs. The abrasive slurry may further include polyacrylic acid (PAA), a down-force enhancer, or a polish-rate inhibitor.

20 Claims, 9 Drawing Sheets

(51) Int. Cl.
*C09G 1/02* (2006.01)
*C09K 3/14* (2006.01)

(56) References Cited

U.S. PATENT DOCUMENTS

| | | | |
|---|---|---|---|
| 5,693,239 A | 12/1997 | Wang et al. | |
| 6,258,137 B1 | 7/2001 | Garg et al. | |
| 6,440,187 B1* | 8/2002 | Kasai | B82Y 30/00 |
| | | | 106/3 |
| 6,620,216 B2* | 9/2003 | Oshima | C09G 1/02 |
| | | | 106/3 |
| 7,422,730 B2 | 9/2008 | Wang | |
| 7,780,751 B2* | 8/2010 | Fujii | C09G 1/02 |
| | | | 451/41 |
| 2001/0037821 A1* | 11/2001 | Staley | B24B 37/04 |
| | | | 134/25.4 |
| 2003/0051413 A1* | 3/2003 | Sakai | C09G 1/02 |
| | | | 51/307 |
| 2006/0108325 A1* | 5/2006 | Everson | C09G 1/02 |
| | | | 216/88 |
| 2009/0004863 A1* | 1/2009 | Kamimura | C09G 1/02 |
| | | | 438/692 |
| 2017/0136604 A1* | 5/2017 | Lu | B24B 37/22 |
| 2018/0002571 A1* | 1/2018 | Stender | B24B 37/044 |
| 2018/0086944 A1* | 3/2018 | Sines | C09G 1/04 |

FOREIGN PATENT DOCUMENTS

| | | |
|---|---|---|
| CN | 1771198 A | 5/2006 |
| TW | 201706392 A | 2/2017 |

OTHER PUBLICATIONS

Liu, Yuling et al., "VLSI substrate material performance and processing test technology engineering," Metallurgical Industry Press, (2002) pp. 141-142.

Qing, Song Yue et al, "Synthetic Diamond Tools Manual (Chinese Edition)," Metallurgical Industry Press, Jan. 1, 2014, ISBN 9787502463434, pp. 22 & 24.

* cited by examiner

CHEMICAL MECHANICAL POLISHING COMPOSITION AND METHOD

PRIORITY CLAIM AND CROSS-REFERENCE

This application claims priority to and the benefit of U.S. Provisional Application No. 62/565,697, filed on Sep. 29, 2017, entitled "Chemical Mechanical Polishing Composition and Method," which application is hereby incorporated herein by reference in its entirety.

BACKGROUND

Generally, semiconductor devices comprise active components (e.g., transistors, diodes, or the like) formed on a substrate. Any number of interconnect layers may be formed over the substrate connecting active components to each other and to other devices. The interconnect layers may be fabricated from low-k dielectric material layers with metallic trenches or vias disposed therein. As the layers of a device are formed, the device is sometimes planarized.

However, the semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, additional problems arise that should be addressed.

BRIEF DESCRIPTION OF THE DRAWINGS

Aspects of the present disclosure may be understood from the following detailed description when read in conjunction with the accompanying Figures. It is noted that, in accordance with standard practice in the industry, various features may not be illustrated to scale. In fact, dimensions of various features may be arbitrarily increased or reduced for clarity of discussion or illustration.

DETAILED DESCRIPTION

The following disclosure provides different embodiments, or examples, for implementing different features. Specific examples of components and arrangements are described below to simplify the present disclosure. These are, of course, merely examples and are not intended to be limiting. For example, the formation of a first feature "over" or "on" a second feature, in the description that follows, may include embodiments in which first and second features are formed in direct contact, and may also include embodiments in which additional features may be formed between first and second features, such that the first and second features may not be in direct contact. Additionally, the present disclosure may repeat reference numerals or letters in various examples. Such repetition is for brevity and clarity, and does not of itself dictate a relationship between various embodiments or configurations discussed.

Furthermore, spatially relative terms, such as "beneath," "below," "lower," "above," "upper," or the like, may be used herein for ease of description; e.g., to reference a relationship between one element or feature and another element or feature. Spatially relative terms are intended to encompass different orientations of a device in use or operation, in addition to orientations illustrated in the Figures. An apparatus may be otherwise oriented (e.g., rotated by 90 degrees or at other orientations) and the spatially relative descriptors used herein may likewise be interpreted accordingly.

Chemical mechanical polishing (or planarization) (CMP) is one method of planarizing features produced in the manufacture of semiconductor devices. The process uses an abrasive material and a reactive chemical slurry in conjunction with a polishing pad. The polishing pad typically has a greater diameter than that of the semiconductor wafer. The pad and wafer are pressed together by operation of a dynamic polishing head. The dynamic polishing head may be rotated around different axes of rotation (e.g., not concentric). The process removes material and tends to even out irregular topography, making the wafer flat or substantially planar. This prepares the wafer for the formation of additional overlying circuit elements. In accordance with representative aspects, chemical mechanical planarization can bring an entire wafer surface within a given depth of field of a photolithography system. Typical depth-of-field specifications are on the order of Angstroms. In other implementations, chemical mechanical planarization may also be employed to selectively remove material based on its location on the wafer.

In general application, a wafer is placed in a carrier head, where the wafer is held in place by a retaining ring. The carrier head and the wafer are then rotated as downward pressure is applied to the wafer to press against a polishing pad. A reactive chemical solution is dispensed on a contacting surface of the polishing pad to aid planarization. The surface of a wafer may thus be planarized using a combination of both mechanical and chemical mechanisms.

Various representative embodiments are described with respect to a specific context, namely a chemical mechanical polishing (CMP) slurry composition and a method of polishing/planarizing a semiconductor wafer using a CMP slurry composition. Various representative embodiments provide chemical mechanical planarization systems, devices, slurry compositions, and methods for planarizing or polishing a workpiece (e.g., a semiconductor wafer, or the like) to exhibit a more uniform or otherwise improved thickness profile.

Figure 1:
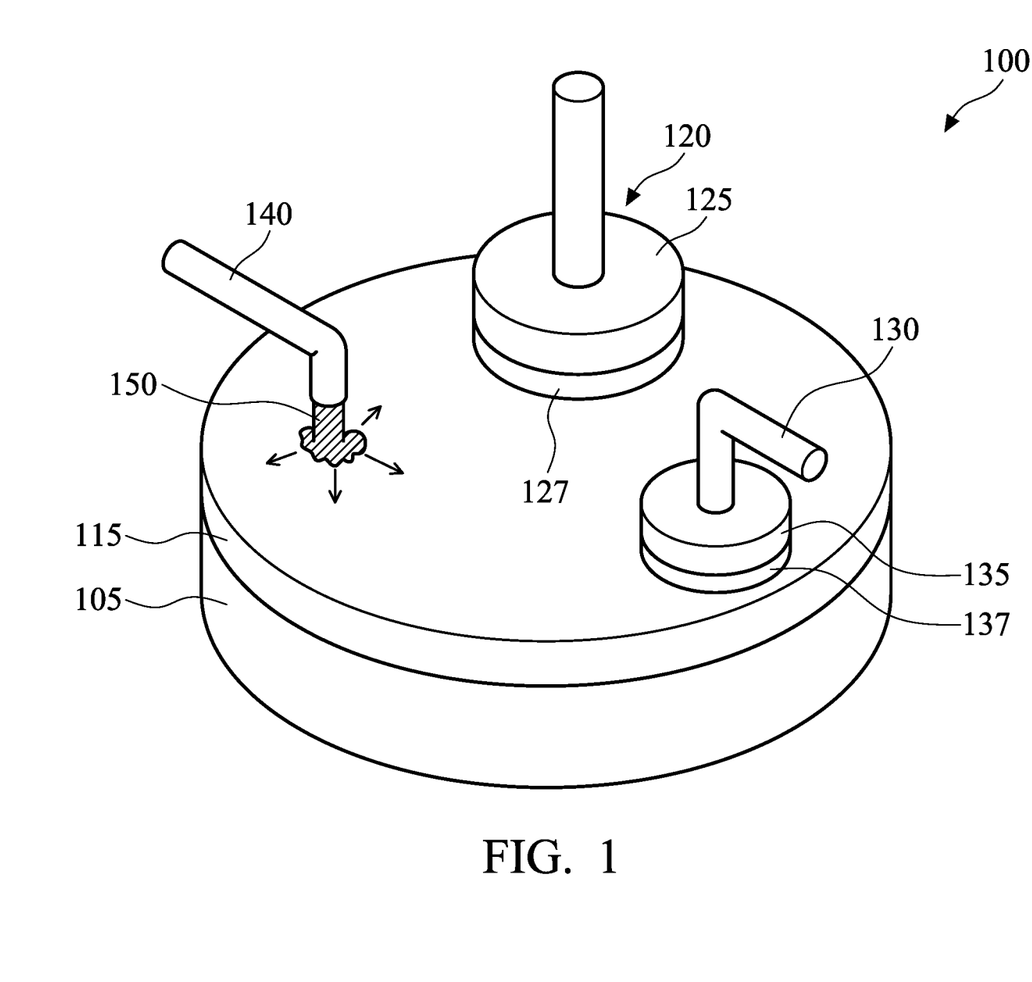
FIG. 1 representatively illustrates a three-quarter isometric view of a polishing apparatus, in accordance with some embodiments.

FIG. 1 illustrates a three-quarter isometric view of a chemical mechanical planarization apparatus 100 in accordance with representative embodiments. Chemical mechanical planarization apparatus 100 includes a platen 105. A polishing pad 115 is placed over chemical mechanical planarization apparatus 100. In some embodiments, polishing pad 115 may include a single layer or a composite layer of materials, such as felts, polymer impregnated felts, microporous polymer films, microporous synthetic leathers, filled polymer films, unfilled textured polymer films, combinations thereof, or the like. Representative polymers include polyurethane, polyolefins, or the like.

In some embodiments, a polisher head 120 is placed over polishing pad 115. Polisher head 120 includes a carrier 125 and a retainer ring 127. Retainer ring 127 is mounted to carrier 125 using mechanical fasteners (e.g., screws, or the like) or other suitable attachment means. During a representative chemical mechanical planarization process, a workpiece (e.g., a semiconductor wafer; not shown in FIG. 1 but illustrated and described below with respect to FIG. 3) is placed within carrier 125 and is held by retainer ring 127. In some embodiments, retainer ring 127 has a substantially annular shape with a substantially hollow center. The workpiece is placed in the center of retainer ring 127 such that retainer ring 127 holds the workpiece in place during a chemical mechanical planarization process. The workpiece is positioned such that a surface to be polished faces in a direction (for example, downward) towards polishing pad 115. Carrier 125 is configured to apply downward force or pressure urging the workpiece into contact with polishing pad 115. Polisher head 120 is configured to rotate the workpiece over polishing pad 115 during the chemical mechanical planarization process, thereby imparting mechanical abrading action to affect planarization or polishing of a contacting surface of the workpiece.

In some embodiments, chemical mechanical planarization apparatus 100 includes a slurry dispenser 140 configured to deposit a slurry 150 onto polishing pad 115. Platen 105 is configured to rotate, causing slurry 150 to be distributed between the workpiece and platen 105 through a plurality of grooves (not illustrated) in retainer ring 127. The plurality of grooves (not illustrated) may extend from an outer sidewall of retainer ring 127 to an inner sidewall of retainer ring 127.

Generally, a given composition of slurry 150 depends on which types of material are to be polished or removed. For example, in some embodiments slurry 150 may comprise a reactant, an abrasive, a surfactant, and a solvent. The reactant may be a chemical, such as an oxidizer or a hydrolyzer, which chemically reacts with a material of the workpiece in order to assist polishing pad 115 in abrading or removing material. In some embodiments in which material to be removed includes, e.g., tungsten, the reactant may be, e.g., hydrogen peroxide, $Cr_2O7$, $MnO_4$, $OsO_4$; although other suitable reactants, such as hydroxylamine, periodic acid, other periodates, iodates, ammonium persulfate, peroxomonosulfates, peroxymonosulfuric acid, perborates, malonamide, combinations of same, or the like, that are configured to aid removal of material may be alternatively, conjunctively, or sequentially employed. In other embodiments, other reactants may be used to remove other types of materials. For example, in some embodiments in which a material to be removed includes, e.g., an oxide, the reactant may comprise, e.g., nitric acid ($HNO_3$), potassium hydroxide (KOH), ammonium hydroxide ($NH_4OH$), combinations of same, or the like.

The abrasive may include any suitable particulate that, in conjunction with the relative mechanical movement of polishing pad 115, is configured to polish or planarize the workpiece. In some embodiments, a representative abrasive includes colloidal alumina. In other embodiments, an abrasive material may additionally include silica, aluminum oxide, cerium oxide, polycrystalline diamond, polymer particles (e.g., polymethacrylate, or the like), combinations of same, or the like.

In particular embodiments, the colloidal alumina may be produced as either an α-phase material which may have a hardness of about 9 Mohs, or as a γ-phase material which may have a hardness of about 8 Mohs. In a representative embodiment, the colloidal alumina may be formed by a sol-gel process with subsequent annealing (e.g., between about 600° C. and about 1200° C.) to produce the colloidal alumina material having a hardness of about 8 Mohs. The colloidal alumina material typically has a particle size range of between about 5 nm and about 100 nm (e.g., about 50 nm). Relative to calcined alumina (which may have a particle size of about 140 μm and a hardness of about 9 Mohs), colloidal alumina has a more rounded shape and is softer, thereby reducing the production of defects when used in a chemical mechanical planarization process as an abrasive component of CMP slurry. In representative aspects, the smaller size of colloidal alumina eliminates, reduces, or otherwise improves, scratch defect, edge-over-erosion, metal protrusion, and metal dishing effects typically associated with CMP slurry abrasives such as calcined alumina.

In a particular embodiment the colloidal alumina is formed using, e.g., a sol-gel process using $AlCl_3$ hydrate and $Al(NO_3)_3$ hydrate (e.g., in a ratio of 0.1~5%) as precursors. For example, the precursor materials may initially be mixed with $Al(OC_3H_7)_3$. Once mixed, surfactants, β-alanine, and sodium dodecylbenzene sulfonate are added to the mixture. The mixture may then be heated to a temperature between about 40° C. and about 100° C. with stirring to form a gel. After the gel has been formed, the heat-treated mixture may then be hydrothermally treated at a temperature between about 200° C. and about 400° C. for a duration of time between about 1 hour and about 2 hours.

The hydrothermally treated mixture is then annealed to form the mixture into either the γ-phase alumina material or the α-phase alumina material. For example, if α-phase alumina material is desired, the hydrothermally treated mixture may be annealed at a temperature range of between about 900° C. and about 1200° C. for a duration of time between about 1 hour and about 2 hours in order to form the colloidal alumina. In an embodiment in which a γ-phase alumina material is desired, the hydrothermally treated mixture may be annealed at a temperature range of between about 600° C. and about 800° C. for a duration of time between about 1 hour and about 2 hours in order to form the colloidal alumina. However, any suitable temperature, such as between about 600° C. and about 1200° C., may be utilized.

The surfactant may be utilized to help disperse the reactant(s) and abrasive(s) within the slurry 150, and to prevent (or otherwise reduce the occurrence of) agglomeration of the abrasive during the chemical mechanical planarization process. In some embodiments, the surfactant may include polyethylene glycol (PEG), polyacrylic acid, sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations thereof, or the like. However, such representative embodiments are not intended to be limited to the recited surfactants. Those skilled in the art will appreciate that any suitable surfactant may be alternatively, conjunctively, or sequentially employed.

A remaining portion of slurry 150 may include a solvent that may be utilized to combine the reactant(s), the abrasive(s), and the surfactant(s), and allow the mixture to be moved and dispersed onto the polishing pad 115. In some embodiments, the solvent may include, e.g., deionized (DI) water, alcohol, or an azeotropic mixture thereof; however, other suitable solvent(s) may be alternatively, conjunctively, or sequentially employed.

Additionally, if desired other additives may also be added in order to help control or otherwise benefit the CMP process. For example, a corrosion inhibitor may be added in order to help control the corrosion. In one particular embodiment the corrosion inhibitor may be an amino acid such as glycine. However, any suitable corrosion inhibitor may be utilized.

In another embodiment chelating agents may also be added to the slurry 150. In an embodiment the chelating agent may be an agent such as ethylenediaminetetraacetic acid (EDTA), $C_6H_8O_7$, $C_2H_2O_4$, combinations of these or the like. However, any suitable chelating agent may be utilized.

In yet another embodiment the slurry 150 may also include pH adjusters in order to control the pH of the slurry 150. For example, in an embodiment a pH adjuster such as HCl, $HNO_3$, $H_3PO_4$, $C_2H_2(COOH)_2$, KOH, $NH_4OH$, combinations of these, or the like, may be added to the slurry 150 in order to adjust the pH of the slurry 150 up or down.

Additionally, other additives may also be added to help control and manage the CMP process. For example, downforce enhancers, polish rate inhibitors, or the like may also be added. Any suitable additives which may be useful to the polishing process may be utilized, and all such additives are fully intended to be included within the scope of the embodiments.

In a particular embodiment, the slurry 150 may be formed by placing the oxidizer, the abrasive, the disperser/surfactant, the pH adjustor, the corrosion inhibitor, and the chelate into the solvent. In such an embodiment, the abrasive may be present between about 0.1%-wt to about 4%-wt, the pH adjustor may be present between about 0.001%-wt to about 0.1%-wt, the corrosion inhibitor is present between about 0.001%-wt to about 0.1%-wt, the disperser is present between about 0.001%-wt to about 0.1%-wt, the oxidizer is present between about 0.001%-wt to about 1.5%-wt, the chelate is present between about 0.001%-wt to about 0.01%-wt, and the solvent is present between about 95%-wt and about 99%-wt. However, any suitable compositions may be utilized.

In another embodiment, the abrasive of the slurry 150 is not only either the γ-phase alumina or the α-phase alumina, but instead comprises a mixture of both γ-phase alumina and α-phase alumina. In such an embodiment, the γ-phase alumina may be between about 10%-wt and about 90%-wt, such as about 20% of the slurry 150 while the α-phase alumina may be between about 90% and about 10%, such as about 80%-wt of the slurry 150. However, any suitable combination of α-phase alumina and γ-phase alumina may be utilized.

In some embodiments, the chemical mechanical planarization apparatus 100 includes a pad conditioner 137 attached to a pad conditioner head 135. Pad conditioner head 135 is configured to rotate pad conditioner 137 over polishing pad 115. Pad conditioner 137 is mounted to pad conditioner head 135 using mechanical fasteners (e.g., screws, or the like) or by other suitable attachment means. A pad conditioner arm 130 is attached to pad conditioner head 135, and is configured to move pad conditioner head 135 and pad conditioner 137 in a sweeping motion across a region of polishing pad 115. In some embodiments, pad conditioner head 135 is mounted to pad conditioner arm 130 using mechanical fasteners (e.g., screws, or the like) or by other suitable attachment means. Pad conditioner 137 comprises a substrate over which an array of abrasive particles is bonded. Pad conditioner 137 removes built-up wafer debris and excess slurry 150 from polishing pad 115 during chemical mechanical planarization processing. In some embodiments, pad conditioner 137 also acts as an abrasive for polishing pad 115 to create a desired texture (such as, e.g., grooves, or the like) against which the workpiece may be polished.

As representatively illustrated in FIG. 1, chemical mechanical planarization apparatus 100 has a single polisher head (e.g., polisher head 120) and a single polishing pad (e.g., polishing pad 115); however, in other embodiments, chemical mechanical planarization apparatus 100 may have multiple polisher heads or multiple polishing pads. In some embodiments in which chemical mechanical planarization apparatus 100 has multiple polisher heads and a single polishing pad, multiple workpieces (e.g., semiconductor wafers) may be polished at a same time. In other embodiments in which chemical mechanical planarization apparatus 100 has a single polisher head and multiple polishing pads, a chemical mechanical planarization process may include a multi-step process. In such embodiments, a first polishing pad may be used for bulk material removal from a wafer, a second polishing pad may be used for global planarization of the wafer, and a third polishing pad may be used, e.g., to buff a surface of the wafer. In some embodiments, different slurry compositions may be used for different stages of chemical mechanical planarization processing. In still other embodiments, a same slurry composition may be used for all chemical mechanical planarization stages.

Figure 2:
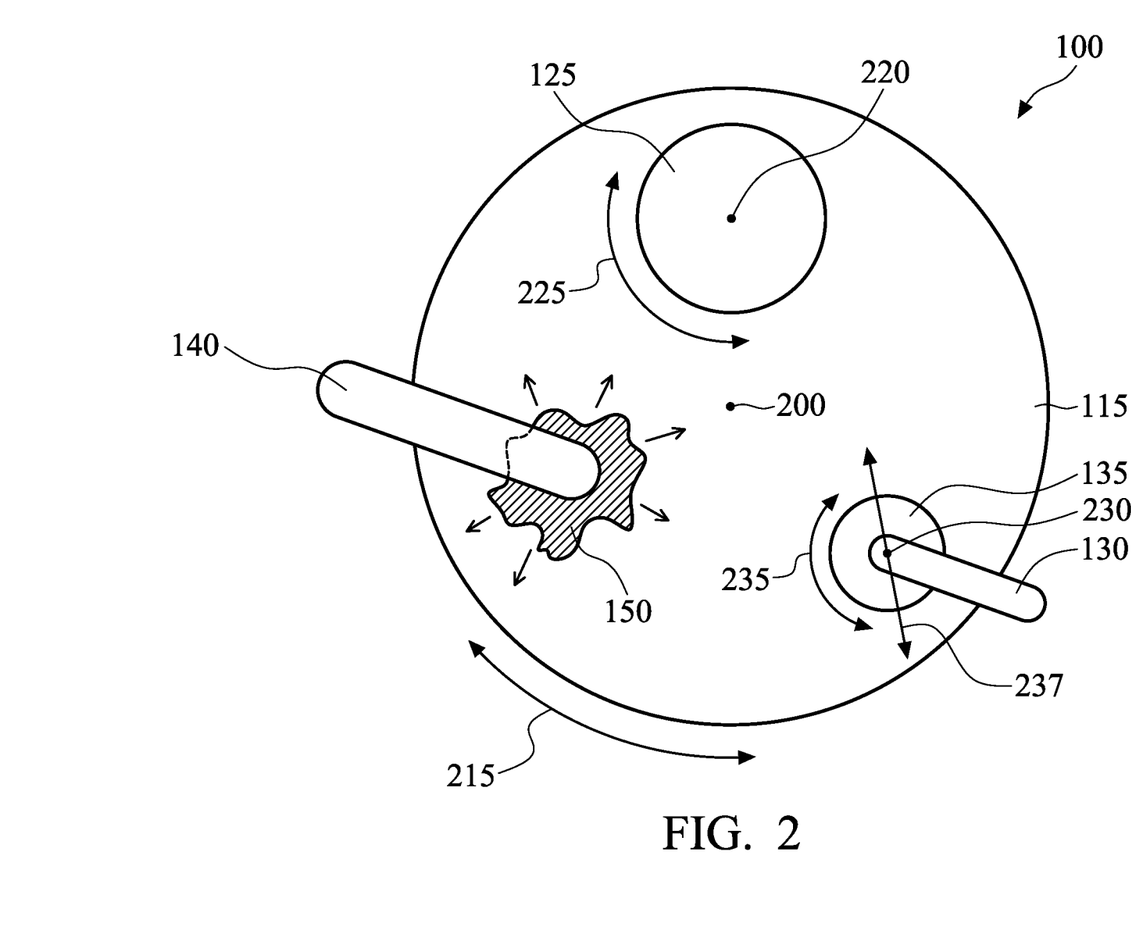
FIG. 2 representatively illustrates a plan (top-down) view of a polishing apparatus in accordance with some embodiments.

FIG. 2 representatively illustrates a top (or plan) view of chemical mechanical planarization apparatus 100 in accordance with some embodiments. Platen 105 (located beneath the polishing pad 115 in FIG. 2) is configured to rotate in a clockwise or a counter-clockwise direction, indicated by a double-headed arrow 215 around an axis extending through centrally-disposed point 200, which is a center point of platen 105. Polisher head 120 is configured to rotate in a clockwise or a counter-clockwise direction, indicated by a double-headed arrow 225 around an axis extending through point 220, which is a center point of polisher head 120. The axis through point 200 is parallel to the axis through point 220. In some embodiments, the axis through point 200 is spaced apart from the axis through point 220. Pad conditioner head 135 is configured to rotate in a clockwise or a counter-clockwise direction, indicated by a double-headed arrow 235 around an axis extending through point 230, which is a center point of pad conditioner head 135. The axis through point 200 is parallel to the axis through point 230. Pad conditioner arm 130 is configured to move pad conditioner head 135 in an effective arc during rotation of platen 105, as indicated by double-headed arrow 237.

Figure 3:
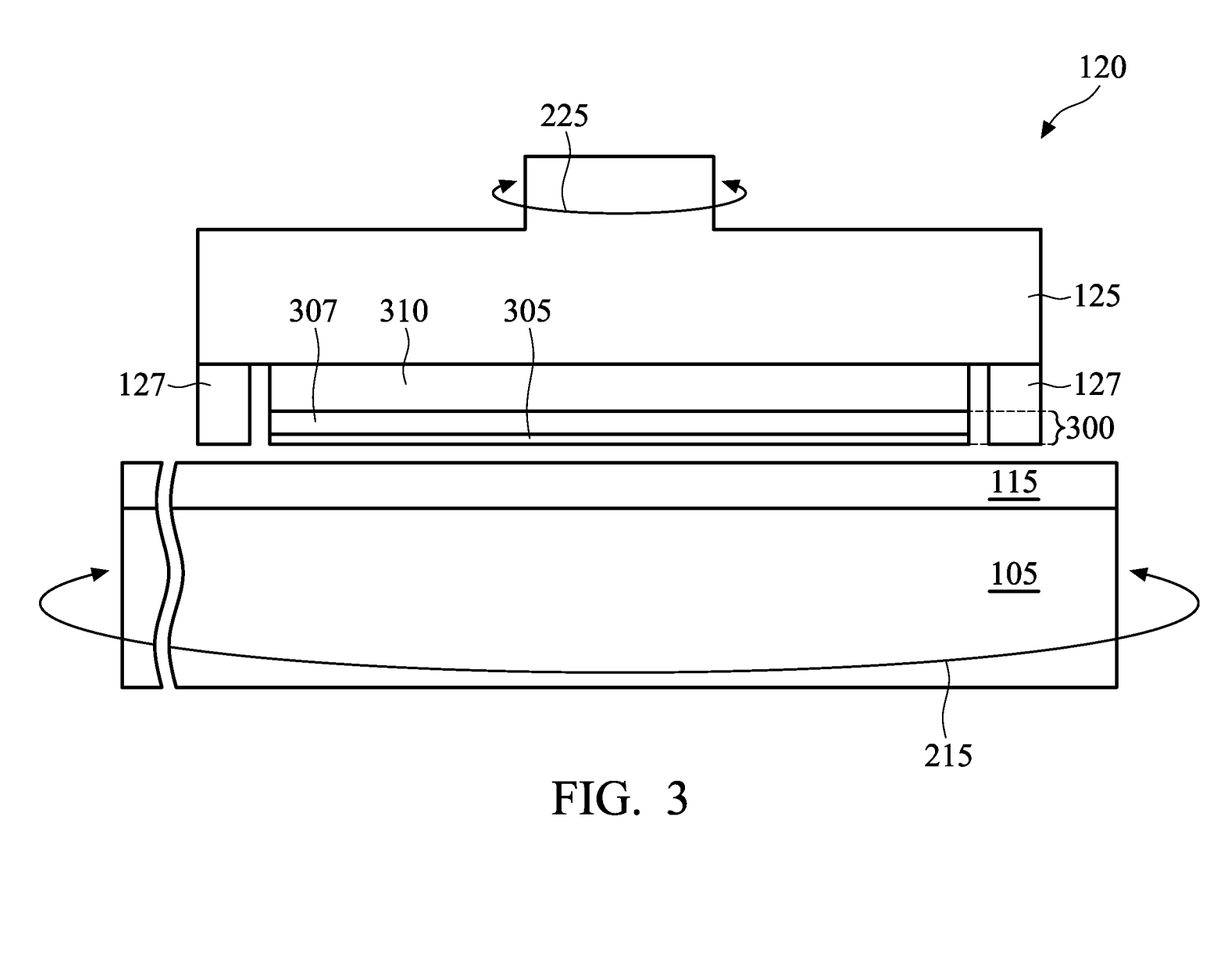
FIG. 3 representatively illustrates an elevation (side) cross-section view of a polisher head and portion of a polishing platen, in accordance with some embodiments.

FIG. 3 representatively illustrates an elevation cross-section view of polisher head 120, in accordance with some embodiments. Carrier 125 incudes a membrane 310 configured to interface with a wafer 300 during a chemical mechanical planarization process. In some embodiments, chemical mechanical planarization apparatus 100 includes a vacuum system (not shown) coupled to polisher head 120, and membrane 310 is configured to pick up and hold wafer 300 onto membrane 310 using vacuum suction.

In some embodiments, wafer 300 may be a semiconductor wafer comprising, for example, a semiconductor substrate (e.g., comprising silicon, a III-V semiconductor material, or the like), active devices (e.g., transistors, or the like) on the semiconductor substrate, and various interconnect structures. Representative interconnect structures may include conductive features, which electrically connect active devices in order to form functional circuits. In various representative embodiments, chemical mechanical planarization processing may be applied to wafer 300 during any stage of manufacture in order to planarize features or otherwise remove undesired material (e.g., dielectric material, semiconductor material, conductive material, or the like) of wafer 300. Wafer 300 may include any subset of the aboveidentified features, as well as other features. In representative aspects, wafer 300 comprises bottommost layer(s) 305 and overlying layer(s) 307. Bottommost layer 305 is subjected to polishing/planarization during a chemical mechanical planarization process. In some embodiments in which bottommost layer 305 comprises tungsten, bottommost layer 305 may be polished to form, e.g., contact plugs contacting various active devices of wafer 300. In embodiments in which bottommost layer 305 comprises copper, bottommost layer 305 may be polished to form, e.g., various interconnect structures of wafer 300. In embodiments in which bottommost layer 305 comprises a dielectric material, bottommost layer 305 may be polished to form, e.g., shallow trench isolation (STI) structures on wafer 300.

In some embodiments, bottommost layer 305 may have a non-uniform thickness (e.g., exhibiting local or global topological variation of an exposed surface of bottommost layer 305) resulting from process variations experienced during deposition of bottommost layer 305. For example, in an embodiment in which the bottommost layer 305 being planarized comprises tungsten, the bottommost layer 305 may be formed by depositing tungsten into an opening through a dielectric layer using a chemical vapor deposition (CVD) process. Due to CVD process variations or other underlying structures, the bottommost layer 305 may have a non-uniform thickness that ranges from about 5 nm to about 20 nm, with a mean value of about 10 nm, and a standard deviation of about 3 nm.

In some embodiments, a thickness profile of bottommost layer 305 may be measured using ellipsometry, interferometry, reflectometry, picosecond ultrasonics, atomic force microscopy (AFM), scanning tunneling microscopy (STM), scanning electron microscopy (SEM), transmission electron microscopy (TEM), or the like. In some embodiments, a thickness measurement apparatus (not shown) may be external to the chemical mechanical planarization apparatus 100, and a thickness profile of the bottommost layer 305 may be measured or otherwise determined before loading the wafer 300 into the chemical mechanical planarization apparatus 100. In other embodiments, a thickness measurement apparatus (not illustrated) may be a part of the chemical mechanical planarization apparatus 100, and a thickness profile of the bottommost layer 305 may be measured or otherwise determined after loading the wafer 300 into the chemical mechanical planarization apparatus 100.

After measurement, the bottommost layer 305 may be planarized by the chemical mechanical planarization apparatus 100. In a particular embodiment the polisher head 120 may be lowered such that the bottommost layer 305 of the wafer 300 is in physical contact with the polishing pad 115. Additionally, the slurry 150 is also introduced onto the polishing pad 115, such that the slurry 150 will come into contact with the exposed surfaces of the bottommost layer 305. For example, the slurry 150 may be introduced at a flow rate of between about 100 cc/min and about 500 cc/min, such as about 250 cc/min. However, any suitable flow rate may be utilized.

During some embodiments, during the CMP process, the polishing pad 115 will rotate at a speed of between about 50 rpm and about 140 rpm, such as about 100 rpm, while the polisher head 120 will rotate at a speed of between about 50 rpm and about 150 rpm, such as about 110 rpm. Additionally, the polisher head 120 will press the wafer 300 and, thus, the bottommost layer 305, against the polishing pad 115 at a downward pressure of between about 0.3 psi and about 4 psi, such as about 2 psi, and the bottommost layer 305 may be held against the pad 115 for a time of between about 5 sec and about 180 sec, such as about 60 sec. However, any suitable process parameters may be utilized.

Figure 4:
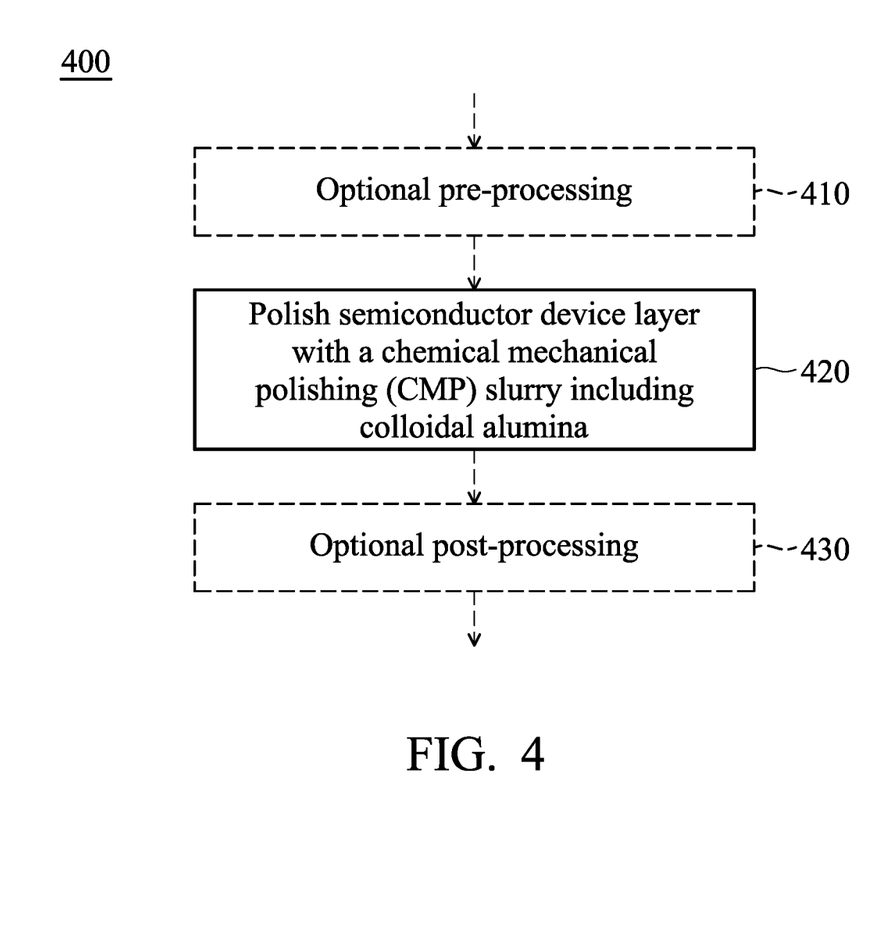
FIGS. 4-7 illustrate flowcharts of representative methods in accordance with some embodiments.

FIG. 4 representatively illustrates a chemical mechanical planarization method 400 in accordance with some embodiments. Method 400 begins with one or more steps 410 of optional pre-processing (e.g., cleaning a semiconductor device workpiece, rinsing the workpiece, attachment of the workpiece, alignment of the workpiece, various semiconductor processing stages, or the like). In step 420, a semiconductor device layer of the workpiece is subjected to chemical mechanical polishing/planarization using a slurry 150 that includes colloidal alumina. Method 400 may continue with one or more steps 430 of optional post-processing (e.g., cleaning/rinsing the semiconductor device workpiece, removal of the workpiece from the chemical mechanical planarization apparatus, various subsequent semiconductor processing stages, or the like).

Figure 5:
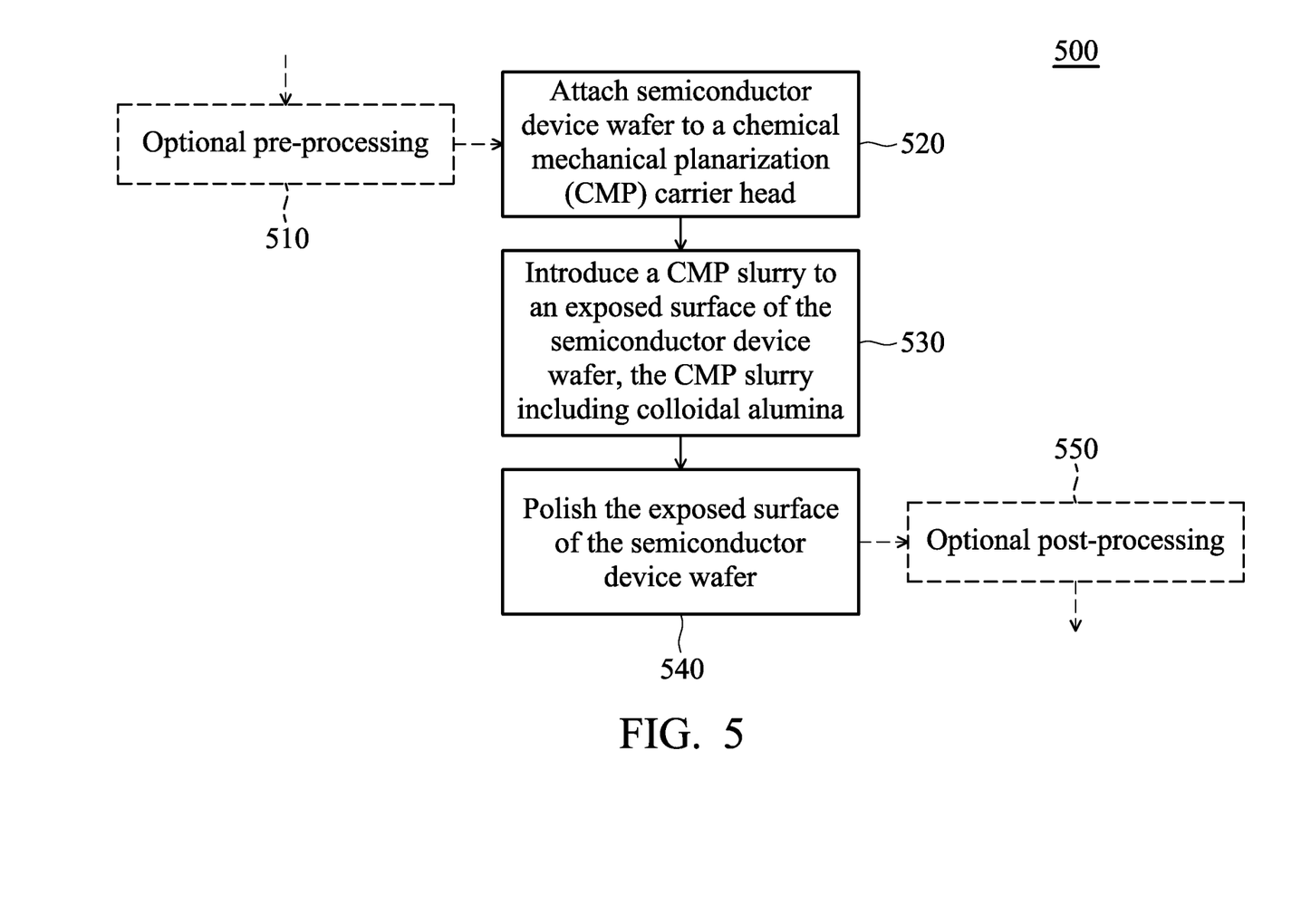

FIG. 5 representatively illustrates a chemical mechanical planarization method 500 in accordance with another embodiment. Method 500 begins with one or more steps 510 of optional pre-processing (e.g., cleaning of a semiconductor device wafer, rinsing the device wafer, or the like). In step 520, a semiconductor device wafer is attached to a CMP carrier head. In step 530, a slurry that includes colloidal alumina is introduced to an exposed surface of the semiconductor device wafer. In step 540, the semiconductor device wafer is polished in a chemical mechanical planarization process using the slurry. Method 500 may continue with one or more steps 550 of optional post-processing (e.g., cleaning the semiconductor device wafer, rinsing the device wafer, removal of the device wafer from the chemical mechanical planarization apparatus, or the like).

Figure 6:
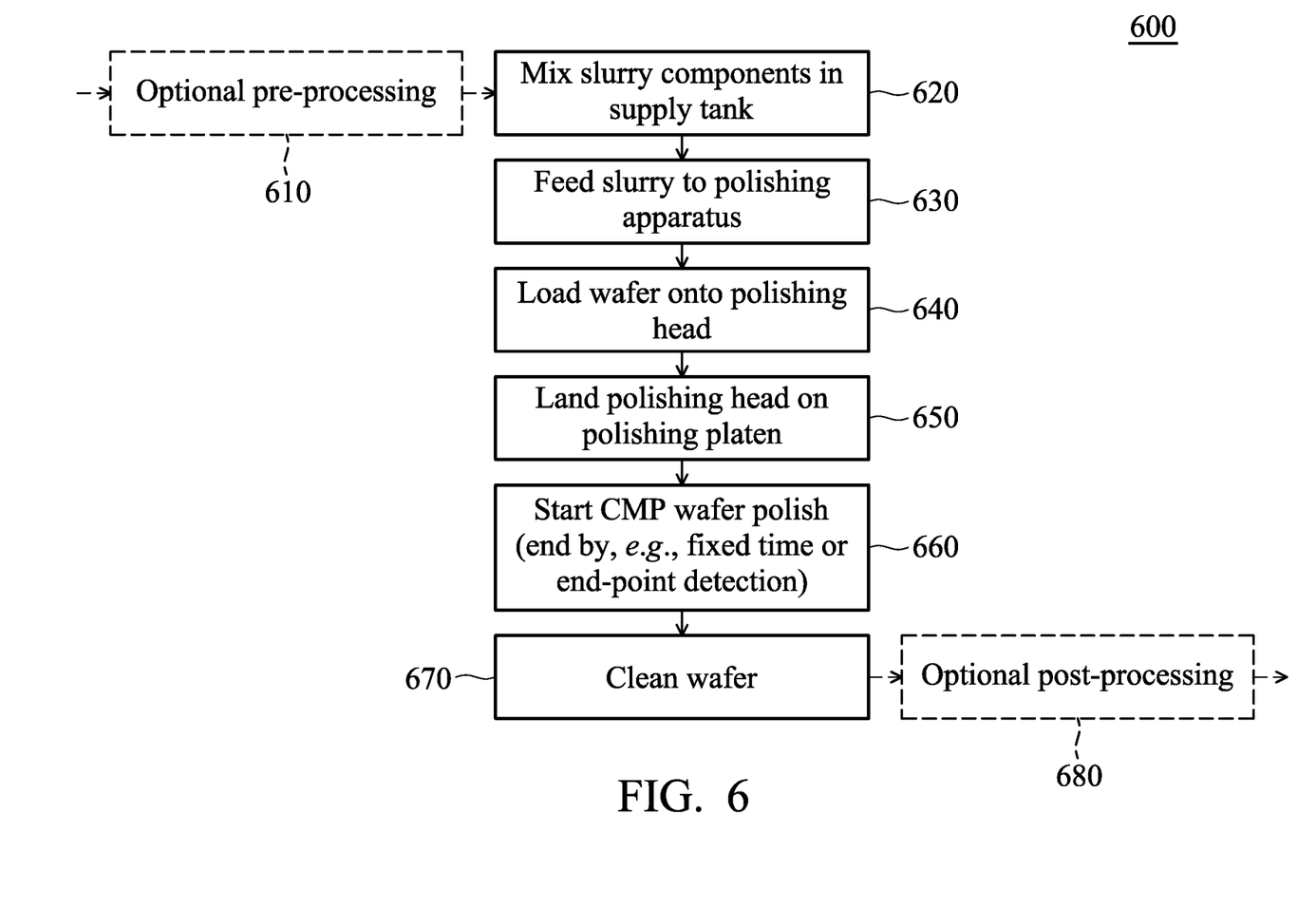

FIG. 6 representatively illustrates a chemical mechanical planarization method 600 in accordance with some embodiments. Method 600 begins with one or more steps 610 of optional pre-processing. In step 620, slurry components are mixed in a slurry supply tank. In a representative embodiment, slurry includes colloidal alumina. In step 630, slurry is fed to a chemical mechanical planarization apparatus. In step 640, a semiconductor wafer is loaded onto a polishing head. In step 650, the polishing head is landed on a polishing platen. In step 660, a chemical mechanical planarization process is engaged to polish the semiconductor wafer using the slurry. In representative aspects, polishing of the semiconductor wafer may be concluded after a pre-determined period of time, or by end-point detection. In some embodiments, an end-point may be detected using a metric associated with a desired degree of planarity. In step 670, the semiconductor wafer is cleaned or rinsed. Method 600 may continue with one or more steps 680 of optional post-processing.

Figure 7:
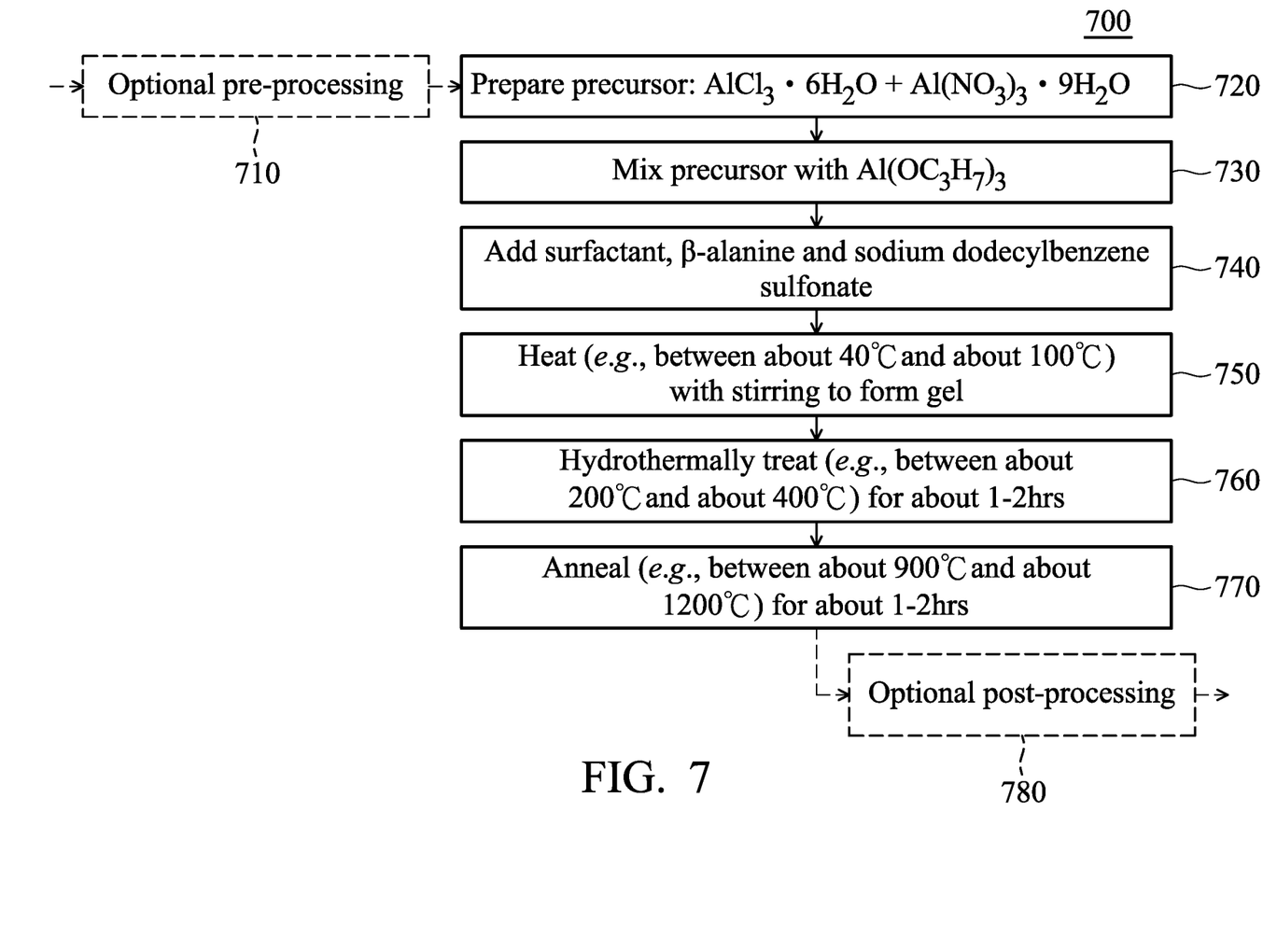

FIG. 7 representatively illustrates a method 700 of producing colloidal alumina abrasive material for inclusion in a slurry, in accordance with some embodiments. Method 700 begins with one or more steps 710 of optional pre-processing (e.g., preparation of reaction vessels, regulation of environmental conditions, or the like). In step 720, $AlCl_3$ hydrate and $Al(NO_3)_3$ hydrate (e.g., in a ratio of 2%) are prepared as precursors. In step 730, the precursor material of step 720 is mixed with $Al(OC_3H_7)_3$. In step 740, surfactants, β-alanine, and sodium dodecylbenzene sulfonate are added to the mixture provided in step 730. In step 750, the mixture of step 740 is heated at a temperature between about 40° C. and about 100° C. with stirring to form a gel. In step 760, the heat-treated mixture of step 750 is hydrothermally treated at a temperature between about 200° C. and about 400° C. for a duration of time between about 1 hour and about 2 hours.

In step 770, the hydrothermally treated mixture of step 760 is annealed at a temperature of between about 900° C. and about 1200° C. for a duration of time between about 1 hour and about 2 hours. Method 700 may continue with one or more steps 780 of optional post-processing (e.g., addition of other slurry components, or the like).

Figure 8A:
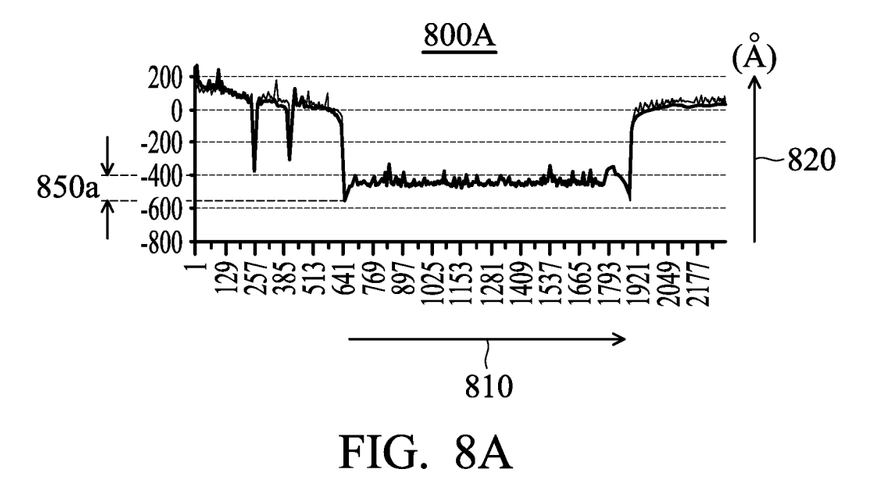
FIGS. 8A, 8B, and 8C are atomic force microscopy (AFM) micrographs for semiconductor device features that have been planarized with representative methods in accordance with some embodiments.
Figure 8B:
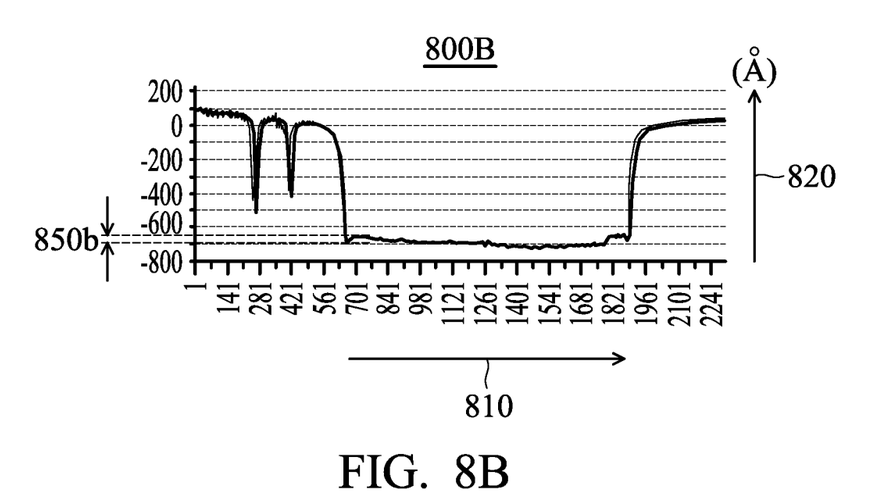
Figure 8C:
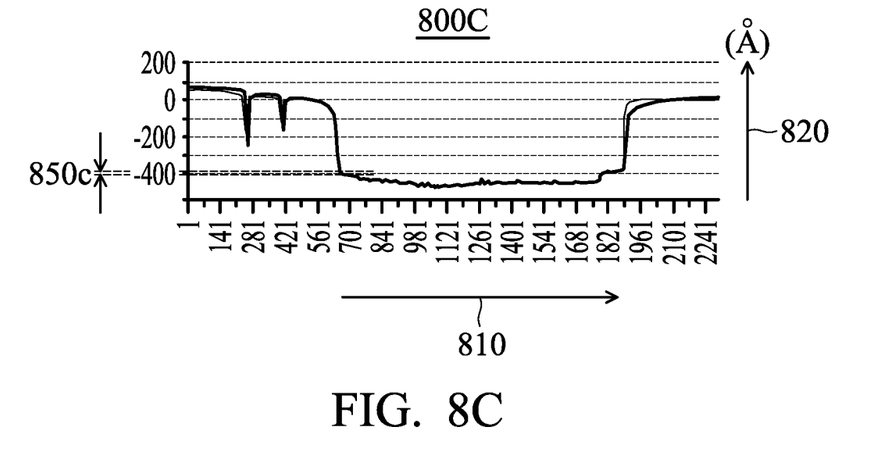

FIGS. 8A, 8B, and 8C representatively illustrate atomic force microscopy (AFM) profiles showing topological differences observed with the use of various alumina abrasives in chemical mechanical planarization processing to planarize a semiconductor device feature.

In FIG. 8A, AFM profile 800A illustrates a horizontal profile 810 and a vertical profile 820 for a representative semiconductor device feature that has been planarized with a chemical mechanical planarization process employing a slurry containing calcined alumina. The calcined alumina has an average particle size of about 140 nm. As can be seen in AFM profile 800A, use of calcined alumina produces a topological difference spanning a range 850$a$ of about 90 Å.

In FIG. 8B, AFM profile 800B illustrates a representative semiconductor device feature that has been planarized with a chemical mechanical planarization process employing a slurry containing colloidal alumina having an average particle size of about 90 nm. As can be seen in AFM profile 800B, use of colloidal alumina with an average particle size of about 90 nm produces a topological difference spanning a range 850$b$ of about 50 Å.

In FIG. 8C, AFM profile 800C illustrates a representative semiconductor device feature that has been planarized with a chemical mechanical planarization process employing a slurry containing colloidal alumina having an average particle size of about 50 nm. As can be seen in AFM profile 800C, use of colloidal alumina with an average particle size of about 50 nm produces a topological difference spanning a range 850$c$ of about 10 Å. As such, by using colloidal alumina with a smaller particle size, edge over erosion performance may be improved while also reducing or eliminating metal protrusion effects (in embodiments in which tungsten or another metal is being planarized), while also reducing oxide dishing, feature erosion, and scratch defects.

Various embodiments presented herein may provide several advantages. For example, a workpiece (e.g., semiconductor wafer, or the like) may be planarized to exhibit a more uniform or otherwise improved thickness that ranges from about 10 nm to about 1 nm, with a mean value of about 2 nm, and a standard deviation of about 1 nm. Various embodiments further allow for reduced polishing time and improved wafer-per-hour (WPH) throughput of a chemical mechanical planarization apparatus.

In an embodiment, a method includes introducing a slurry to a chemical mechanical polishing pad, the slurry comprising colloidal alumina; and polishing a semiconductor device layer with the slurry and the chemical mechanical polishing pad. In an embodiment the colloidal alumina has a particle size of between about 5 nm and about 100 nm. In an embodiment the colloidal alumina has a particle size of about 50 nm. In an embodiment the colloidal alumina includes at least one of an alpha phase material and a gamma phase material. In an embodiment the colloidal alumina includes the alpha phase material. In an embodiment the colloidal alumina includes the gamma phase material. In an embodiment the colloidal alumina includes both the gamma phase material and the alpha phase material.

In another embodiment, a method includes attaching a semiconductor device wafer to a chemical mechanical planarization (CMP) carrier head; introducing a CMP slurry to an exposed surface of the semiconductor device wafer, the CMP slurry comprising colloidal alumina; and after introducing the CMP slurry, polishing the exposed surface of the semiconductor device wafer. In an embodiment the colloidal alumina has a particle size of between about 5 nm and about 100 nm. In an embodiment the colloidal alumina has a particle size of about 50 nm. In an embodiment the colloidal alumina has a concentration within the CMP slurry of between about 0.1%-wt and about 4%-wt. In an embodiment the colloidal alumina includes an alpha phase material having a hardness of about 9 Mohs. In an embodiment the colloidal alumina further includes a gamma phase material having a hardness of about 8 Mohs.

In yet another embodiment, a chemical mechanical polishing slurry includes a reactant; colloidal alumina; and a dispersant. In an embodiment the colloidal alumina has a particle size of between about 5 nm and about 100 nm. In an embodiment the colloidal alumina has a particle size of about 50 nm. In an embodiment the reactant is an oxidant. In an embodiment the colloidal alumina includes at least one of an alpha phase material having a first hardness of about 9 Mohs, and a gamma phase material having a second hardness of about 8 Mohs. In an embodiment the colloidal alumina includes both the alpha phase material and the gamma phase material. In an embodiment the alpha phase material has a concentration within the slurry of between about 90% and about 10% and the gamma phase material has a concentration within the slurry of between about 10% and about 90%.

The foregoing outlines features of several embodiments so that those skilled in the art may better understand aspects of the present disclosure. Skilled artisans will appreciate that they may readily use the present disclosure as a basis for designing or modifying other processes or structures for carrying out same or similar purposes, or for achieving same or similar advantages of embodiments discussed herein. Those skilled in the art will also realize that such equivalent constructions do not depart from the spirit and scope of the present disclosure, and that various changes, substitutions, or alterations may be made without departing from the spirit and scope of the present disclosure.

What is claimed is:

1. A method comprising:
   introducing a slurry to a chemical mechanical polishing pad, the slurry comprising colloidal alumina, wherein the alumina is formed using a sol-gel process, the sol-gel process utilizing β-alanine; and
   polishing a semiconductor device layer with the slurry and the chemical mechanical polishing pad.

2. The method of claim 1, wherein the colloidal alumina has a particle size of between about 5 nm and about 100 nm.

3. The method of claim 2, wherein the colloidal alumina has a particle size of about 50 nm.

4. The method of claim 1, wherein the colloidal alumina comprises at least one of an alpha phase material or a gamma phase material.

5. The method of claim 4, wherein the colloidal alumina comprises the alpha phase material.

6. The method of claim 4, wherein the colloidal alumina comprises both the gamma phase material and the alpha phase material.

7. A method comprising:
   forming colloidal alumina using a sol-gel process, the sol-gel process using $AlCl_3$ and $Al(NO_3)_3$ as precursors along with β-alanine, wherein the $AlCl_3$ and $Al(NO_3)_3$ are in a ratio of 0.1~5% and wherein a product is hydrothermally treated at a temperature range of between about 600° C. and about 800° C. for a duration of time between about 1 hour and about 2 hours;

attaching a semiconductor device wafer to a chemical mechanical planarization (CMP) carrier head;

introducing a CMP slurry to an exposed surface of the semiconductor device wafer, the CMP slurry comprising the colloidal alumina; and after introducing the CMP slurry, polishing the exposed surface of the semiconductor device wafer until the semiconductor device wafer has a topological difference spanning a range of about 50 Å.

8. The method of claim 7, wherein the colloidal alumina has a particle size of between about 5 nm and about 100 nm.

9. The method of claim 7, wherein the colloidal alumina has a concentration within the CMP slurry of between about 0.1%-wt and about 4%-wt.

10. The method of claim 7, wherein the colloidal alumina comprises an alpha phase material having a hardness of about 9 Mohs.

11. The method of claim 10, wherein the colloidal alumina further comprises a gamma phase material having a hardness of about 8 Mohs.

12. A method comprising:

forming a chemical mechanical polishing slurry comprising:

placing a reactant into a solvent such that the reactant is present between about 0.001%-wt and about 1.5%-wt;

forming a sol-gel formed colloidal alumina utilizing β-alanine;

placing the a sol-gel formed colloidal alumina into the solvent, wherein the sol-gel formed colloidal alumina is present between about 0.1%-wt and about 4%-wt; and placing a dispersant into the solvent such that the dispersant is present between about 0.001%-wt and about 0.1%-wt;

placing a pH adjustor into the solvent such that the pH adjustor is present between about 0.001%-wt and about 0.1%-wt;

placing a corrosion inhibitor into the solvent such that the corrosion inhibitor is present between about 0.001%-wt to about 0.1%-wt; and placing a chelate into the solvent such that the chelate is present between about 0.001%-wt and about 0.01%-wt, wherein the solvent is present between about 95%-wt and about 99%-wt.

13. The method of claim 12, wherein the colloidal alumina has a particle size of between about 5 nm and about 100 nm.

14. The method of claim 13, wherein the colloidal alumina has a particle size of about 50 nm.

15. The method of claim 12, wherein the reactant is an oxidant.

16. The method of claim 15, wherein the colloidal alumina comprises at least one of an alpha phase material having a first hardness of about 9 Mohs, or a gamma phase material having a second hardness of about 8 Mohs.

17. The method of claim 16, wherein the alpha phase material has a concentration within the slurry of between about 90% and about 10% and the gamma phase material has a concentration within the slurry of between about 10% and about 90%.

18. The method of claim 1, wherein the slurry comprises a dispersant, the dispersant having a concentration of between about 0.001%-wt and about 0.1%-wt.

19. The method of claim 1, wherein the sol-gel process uses $AlCl_3$ and $Al(NO_3)_3$ as precursors, wherein the $AlCl_3$ and $Al(NO_3)_3$ are in a ratio of 0.1~5% and wherein a product is hydrothermally treated at a temperature range of between about 600° C. and about 800° C. for a duration of time between about 1 hour and about 2 hours.

20. The method of claim 7, wherein the slurry comprises a pH adjustor, the pH adjustor having a concentration of between about 0.001%-wt and about 0.1%-wt.

* * * * *